United States Patent
Carpenter et al.

(10) Patent No.: US 9,324,675 B2
(45) Date of Patent: Apr. 26, 2016

(54) STRUCTURES FOR REDUCING CORROSION IN WIRE BONDS

(71) Applicants: Burton J. Carpenter, Austin, TX (US); Chu-Chung Lee, Round Rock, TX (US); Tu-Anh N. Tran, Austin, TX (US)

(72) Inventors: Burton J. Carpenter, Austin, TX (US); Chu-Chung Lee, Round Rock, TX (US); Tu-Anh N. Tran, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 40 days.

(21) Appl. No.: 14/262,381

(22) Filed: Apr. 25, 2014

(65) Prior Publication Data

US 2015/0311173 A1 Oct. 29, 2015

(51) Int. Cl.
*H01L 23/48* (2006.01)
*H01L 23/52* (2006.01)
*H01L 29/40* (2006.01)
*H01L 23/00* (2006.01)

(52) U.S. Cl.
CPC ............... *H01L 24/49* (2013.01); *H01L 24/05* (2013.01); *H01L 24/43* (2013.01); *H01L 2224/05624* (2013.01); *H01L 2224/431* (2013.01); *H01L 2224/432* (2013.01); *H01L 2224/4569* (2013.01); *H01L 2224/45124* (2013.01); *H01L 2224/45139* (2013.01); *H01L 2224/45144* (2013.01); *H01L 2224/45147* (2013.01); *H01L 2224/45664* (2013.01); *H01L 2224/45687* (2013.01); *H01L 2224/4845* (2013.01); *H01L 2224/85444* (2013.01)

(58) Field of Classification Search
CPC ......... H01L 24/05; H01L 24/48; H01L 24/49; H01L 2924/14
See application file for complete search history.

(56) References Cited

U.S. PATENT DOCUMENTS

| 7,468,560 | B2* | 12/2008 | Guengerich et al. .......... 257/784 |
| 7,781,897 | B2* | 8/2010 | Hosseini et al. .............. 257/784 |
| 2005/0184133 | A1 | 8/2005 | Clauberg et al. |
| 2009/0029542 | A1 | 1/2009 | Subido et al. |
| 2013/0277825 | A1 | 10/2013 | Zhang et al. |

\* cited by examiner

Primary Examiner — Howard Weiss

(57) ABSTRACT

A semiconductor structure includes a bond pad and a wire bond coupled to the bond pad. The wire bond includes a bond in contact with the bond pad. The wire bond includes a coating on a surface of the wire bond, and a first exposed portion of the wire bond in a selected location. The wire bond is devoid of the coating over the selected location of the wire bond, and an area of the first exposed portion is at least one square micron.

10 Claims, 3 Drawing Sheets

STRUCTURES FOR REDUCING CORROSION IN WIRE BONDS

BACKGROUND

1. Field

Embodiments of this disclosure relate to packaged semiconductor devices. More particularly, this disclosure relates to devices and methods for reducing corrosion in wire bonds.

2. Related Art

Wire bonding is used in the semiconductor industry to form electrical connections between contact pads on an integrated circuit (IC) die and contact pads on a package substrate. Ball bonds are formed with one end of the wire on the contact pads of the IC die and wedge or stitch bonds are formed with the other end of the wire on the contact pads of the package substrate. Alternatively, wedge bonds can be used on both ends of the wire at the bond pad on the IC die and the bond pad on the package substrate.

In some instances, the wire is coated with one or more layers of a metal, ceramic and/or organic material that exhibit desirable characteristics such as promoting formation of a bond during the wire bonding process and improving reliability in air-to-air temperature cycling and high temperature bake. The coating can also help prevent corrosion of the wire when the packaged semiconductor device during assembly and when used in the field. A problem can arise if portions of the coating are removed during the bonding process thereby exposing the wire to potentially corrosive elements.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Devices and methods disclosed herein help minimize or reduce corrosion in wire bonds by removing coating to expose a portion of a wire in a selected location. The location selected is generally in the vicinity of areas of the wire bond that were unintentionally exposed during the bonding process. Corrosion of the metal wire may be observed when the package undergoes high temperature bake such as 175° C. for long duration such as 1000 hours. In situations where the coating is a metal more noble than the underlying wire metal, the exposed areas cause the formation of an electrochemical corrosion cell, whereby the metal coating acts as a cathode, and the exposed underlying metal wire portion acts as anode from which portions of the wire metal will be removed, or corrode. When the unintentionally exposed areas are small compared to the area of the remaining portion, then the relatively small anode area causes corrosion to occur quickly. By selectively removing additional portions of the coating material, the anode area is increased relative to the cathode area, and the corrosion rate at each exposed locations is significantly slower. In addition, the selectively exposed area helps attract corrosive agents that would otherwise be attracted to the unintentionally exposed areas, potentially causing a deeper level of corrosion that could impair conductivity or even break the wire. By selectively exposing areas of the wire, corrosion may still occur, but the corrosion level is not likely to be as extensive, thereby promoting reliability and integrity of the wire bond.

Figure 1:
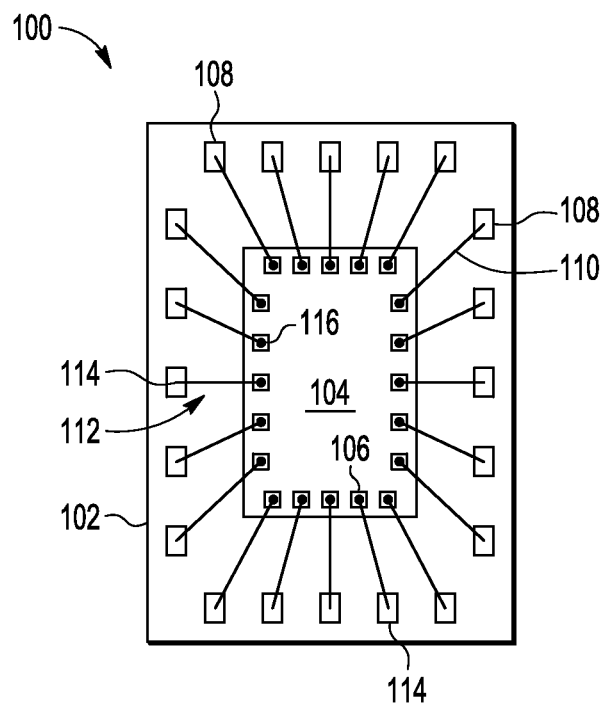
FIG. 1 is a top view of an embodiment of semiconductor device including an integrated circuit die wire bonded to a package substrate prior to an encapsulation process.

FIG. 1 is a top view of an embodiment of semiconductor device 100 including an integrated circuit die 104 wire bonded to a package substrate 102 prior to an encapsulation process. The die 104 includes bond pads 106 for electrical access to the functional circuitry of the die. The bond pads 106 may be made of aluminum, aluminum alloyed with copper and/or silicon, aluminum on copper, or other suitable material(s). The package substrate 102 includes bond pads 108 for making electrical connections to the substrate 102. The bond pads 108 may be made of gold, gold on nickel, gold on palladium, gold on copper, silver or other suitable material(s). Wire bonds 112 including a respective ball bond 116 on each of bond pads 106 and stitch bond 114 on each of bond pads 108 also include a connecting wire 110 between ball bond 116 and stitch bond 114. The wire bond 112 may be made of gold, gold alloyed with other elements, copper, aluminum, silver or other suitable material(s). The package substrate 102, for example, may be a mechanical support for the bond pad 108 or may include electrical circuitry such as routing lines and conductive interconnects, some of which may be electrically coupled to bond pad 108. For example, package substrate 102 can be a leadframe, or ball grid array substrate made of epoxy, plastic, FR-4, FR5, a Bismaleimide-Triazine resin, a fiberglass reinforced epoxy laminate, polytetrafluorethylene, ceramic, polyimide, or other suitable material.

Figure 2:
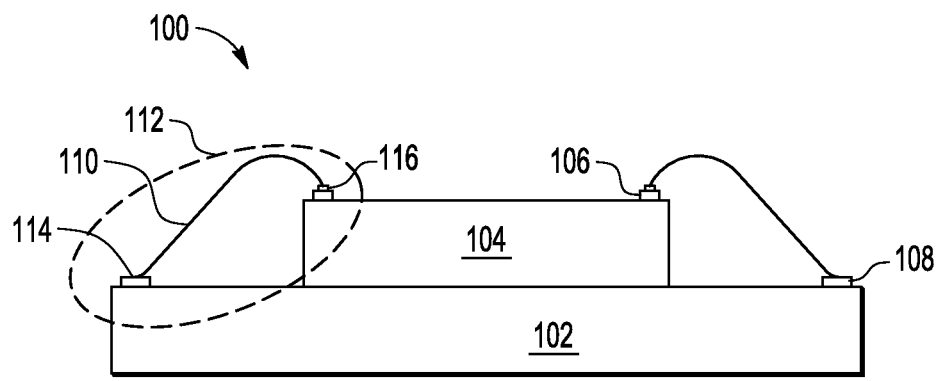
FIG. 2 is a cross-sectional side view of a wire bonded IC as depicted in FIG. 1.

FIG. 2 is a cross-sectional side view of a wire bonded IC as depicted in FIG. 1. Wire 110 is bonded to a bond pad 106 and pad 108 to form an electrical connection between the integrated circuit 104 and the package substrate 102. Although a wire bond 112 is depicted and the description refers to a wire bond as a concrete example, other bonding arrangements may be substituted for the wire bond.

Figure 3:
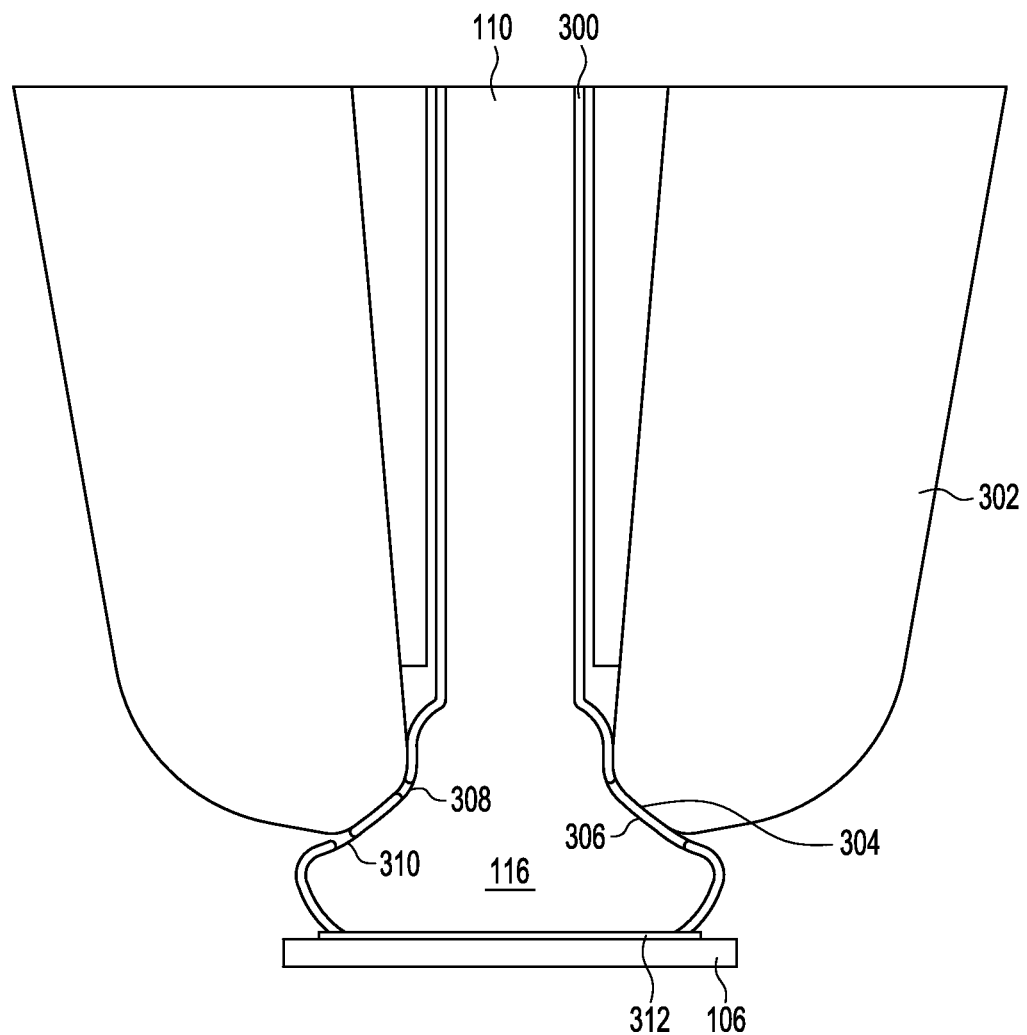
FIG. 3 is a cross-sectional side view of an embodiment of a ball bond formed during a bonding process.

FIG. 3 is a cross-sectional side view of an embodiment of the formation of ball bond 116 on bond pad 106 using a wire bond process. In the exemplary structure depicted in FIG. 3 wire 110 is made from copper or a copper alloy and a coating 300 of a layer of palladium, or gold and palladium. In other embodiments, wire 110 may be formed of material such as copper, copper alloy, silver, silver alloy, gold, gold alloy, aluminum or aluminum alloy, or other suitable conductive material or combination of materials. Coating 300 may be made of one or more materials such a metal, a ceramic, or organic material, or combinations thereof. The coating 300 is formulated to prevent or at least minimize corrosion and oxidation of the underlying wire 110 and may also exhibit other desirable characteristics such as promoting formation of the bond during the wire bonding process and high reliability in air-to-air temperature cycling and high temperature bake. The coating may additionally or alternatively be formulated to provide electrical insulation to the wire 110 such that when the wires 110 come into contact with each other, they do not electrically short to each other.

Wire 110 is held in a bonding tool referred to as capillary 302 while a free air ball (FAB) (not shown) at the end of wire 110 is formed by electrical flame-off that heats the end of wire 110 to a malleable state. The FAB is then lowered to contact bond pad 106, compressed, and subjected to ultrasonic generation (USG). The vibration of the USG effectively scrubs the FAB against the aluminum bond pad 106, promoting interdiffusion of the metal of the FAB and the metal of the bond pad 106, creating a conductive intermetallic compound 312. At the same time, portions 306, 308, 310 of wire 110 may be exposed where coating 300 is unintentionally removed by a surface 304 of the capillary 302 rubbing against coating 300 during the bonding process. A chamfered area where the capillary 302 contacted the ball bond 116 remains after the wire bonding process.

The device 100 (FIG. 1) is typically encapsulated in a mold compound once wire bonds 112 are formed. One problem that can arise when one or more relatively small areas of coating 300 are unintentionally removed is that corrosive elements such as adhesion promoters that can contain sulfur or sulfate from the mold compound are attracted to the underlying wire 110. The smaller the area exposed, the deeper the corrosion may extend into wire 110, eventually affecting the ability of wire 110 to conduct electricity reliably.

In situations where the coating 300 is a metal more noble than the underlying metal in wire 110, the exposed areas of wire 110 cause the formation of an electrochemical corrosion cell, whereby the metal coating 300 acts as a cathode, and the exposed underlying metal wire 110 acts as anode from which portions of the wire 110 will be removed, or corrode.

Figure 4:
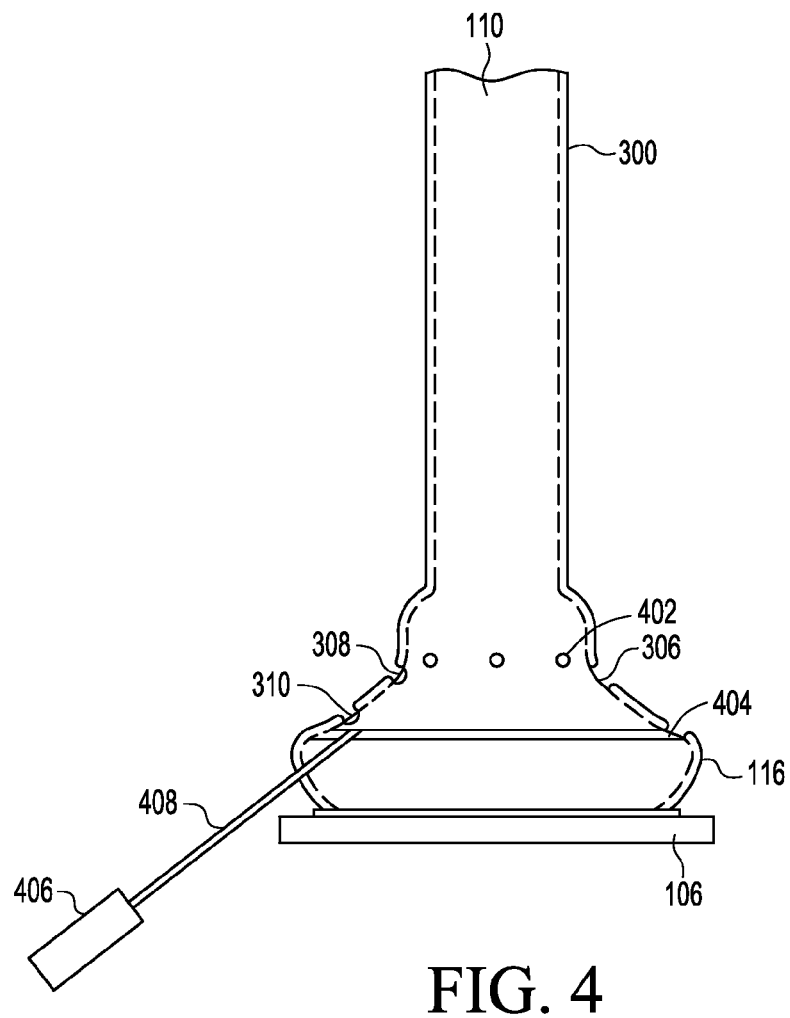
FIG. 4 is a side view of the ball bond of FIG. 3 after the bonding process and intentionally removing a portion of coating on the wire.

FIG. 4 is a side view of the ball bond 116 of FIG. 3 after the bonding process and after intentionally removing a portion 404 of coating 300 on the wire 110. In the example shown, exposed portions 306-310 remain and other unintentionally exposed portions 402 on the exterior surface of ball bond 116 are shown. Intentionally exposed portion 404 of wire 110 is formed by removing more of coating 300 in a selected location. Portion 404 of coating 300 can be removed using one or more suitable processes including removal using laser 406 capable of emitting a laser beam 408, a chemical, and/or a mechanical device. Intentionally exposed portion 404 can have any suitable shape such as a stripe, a geometric shape, and/or an irregular shape. A minimum size or area for exposed portion 404 can be specified, for example, greater than or equal to one square micron.

The location of exposed portion 404 is typically chosen to be close enough to unintentionally exposed portions 306-310, 402 to attract corrosive elements away from exposed portions 306-310, 402, or at least diffuse the corrosive elements over a larger area of exposed portions 306-310, 402 and 404 to prevent the corrosion from extending to a level that would affect the reliability of wire bond 112. Also, the intentionally exposed area 404 increases the total anode area relative to the cathode area, reducing the anodic corrosion rate caused by the overall electrochemical cell. In some embodiments, the intentionally exposed portion 404 can be located to include one or more of the unintentionally exposed portions 306-310, 402, thereby incorporating the one or more unintentionally exposed portions 306-310, 402 in the intentionally exposed portion 404.

Additional intentionally exposed portions having the same or different size and shape may be formed in suitable locations relative to unintentionally exposed portions 306-310, 402. Further, an intentionally exposed portion may be formed on a section of wire 110 that is not part of ball bond 116.

Figure 5:
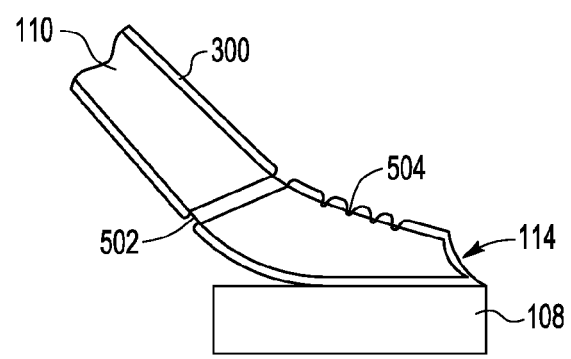
FIG. 5 is a side view of an embodiment of a stitch bond of FIG. 1 after bonding and intentionally removing a portion of coating on the wire.

FIG. 5 is a side view of an embodiment of a stitch bond 114 of FIG. 1 after bonding and intentionally removing a portion 502 of coating 300 on wire 110. Stitch bond 114 can also include unintentionally exposed portions 504 of wire 110 that were formed during the bonding process. Intentionally exposed portion 502 of wire 110 is formed by removing more of coating 300 in a selected location. Portion 502 of coating 300 can be removed using one or more suitable processes including removal using laser, a chemical, and/or a mechanical device. Intentionally exposed portion 502 can have any suitable shape such as a stripe, a geometric shape, and/or an irregular shape. The location of exposed portion 502 is typically chosen to be close enough to unintentionally exposed portions 504 to attract corrosive elements away from exposed portions 504, or at least diffuse the corrosive elements over a larger area of exposed portions 504 and 502 to prevent the corrosion from extending to a level that would affect the reliability of wire bond 112. Also, the intentionally exposed area 502 increases the total anode area relative to the cathode area, reducing the anodic corrosion rate caused by the overall electrochemical cell. In some embodiments, the intentionally exposed portion 502 can be located to include one or more of the unintentionally exposed portions 504, thereby incorporating the one or more unintentionally exposed portions 504 in the intentionally exposed portion 502.

Additional intentionally exposed portions having the same or different size and shape may be formed in suitable locations relative to unintentionally exposed portions 504. Further, an intentionally exposed portion may be formed on a section of wire 110 that is not part of stitch bond 114.

It should be understood that in this description, as in the art generally, materials referred to by their elemental names may contain trace impurities and/or be alloyed with small amounts of other materials. For example, the wire material commonly referred to as "copper" in the art may be alloyed with aluminum or silicon or both in small amounts, such as a few percent by weight or less, to modify certain properties of pure copper.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all of the claims.

Unless stated otherwise, terms such as "first" and "second" are used to arbitrarily distinguish between the elements such terms describe. Thus these terms are not necessarily intended to indicate temporal or other prioritization of such elements.

We claim:

1. A semiconductor structure comprising:
   a bond pad, and
   a wire bond coupled to the bond pad, wherein
      the wire bond includes a bond in contact with the bond pad,
      the wire bond includes a coating on a surface of the wire bond; and
   a first exposed portion of the wire bond in a selected location, wherein
      the wire bond is devoid of the coating over the selected location of the wire bond, and
      an area of the first exposed portion is at least one square micron;
   wherein the wire bond includes one or more exposures in the coating in proximity to the first exposed portion of the wire bond.

2. The semiconductor structure of claim 1, wherein the one or more exposures are located within a wire bonding tool contact area of the wire bond.

3. The semiconductor structure of claim 1, wherein the selected location is located outside of a wire bonding tool contact area.

4. The semiconductor structure of claim 1, wherein the one or more exposures are located outside of a wire bonding tool contact area.

5. The semiconductor structure of claim 1, wherein the selected location is located within a wire bonding tool contact area.

6. The semiconductor structure of claim 1, wherein
the wire bond further includes one or more additional coatings,
the semiconductor structure further includes a second exposed portion of the wire bond, and
the wire bond is devoid of the one or more additional coatings over an area of the second exposed portion.

7. The semiconductor structure of claim 1, wherein
the semiconductor structure further includes a plurality of wire bonds and a plurality of exposed portions,
each of the plurality of wire bonds includes at least one of the plurality of exposed portions, and
the plurality of exposed portions are aligned along an edge of the semiconductor structure.

8. The semiconductor structure of claim 1, wherein
the first exposed portion is located to attract corrosive elements way from in proximity to the first exposed portion are located to attract corrosive elements away from the one or more exposures in the coating in proximity to the first exposed portion of the wire bond.

9. The semiconductor structure of claim 1, wherein
the one or more exposures in the coating in proximity to the first exposed portion of the wire bond are unintentionally created by a bonding tool during the wire bonding process; and
the first exposed portion is intentionally created after the wire bonding process.

10. A semiconductor structure comprising:
a plurality of bond pads aligned along an edge of the semiconductor structure, and
a plurality of wire bonds coupled to the plurality of bond pads, wherein
  each of the plurality of wire bonds includes a bond in contact with one of the plurality of bond pads, and
  each of the plurality of wire bonds includes a coating on a respective wire bond surface; and
a plurality of exposed portions within a selected area, wherein
  the selected area spans across the plurality of wire bonds in a direction along the edge of the semiconductor structure,
  each of the plurality of wire bonds includes at least one exposed portion of the plurality of exposed portions, and
  each of the plurality of wire bonds is devoid of the coating over the at least one exposed portion,
wherein the semiconductor structure further includes one or more additional exposed portions, wherein the wire bond is devoid of the coating over the one or more additional exposed portions.

* * * * *